US007005101B2

(12) United States Patent
Murugan

(10) Patent No.: US 7,005,101 B2
(45) Date of Patent: Feb. 28, 2006

(54) VIRTUAL GATE DESIGN FOR THIN PACKAGES

(75) Inventor: Selvarajan Murugan, Kuala Lumpur (MY)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/378,376

(22) Filed: Mar. 3, 2003

(65) Prior Publication Data

US 2003/0132019 A1 Jul. 17, 2003

Related U.S. Application Data

(62) Division of application No. 09/953,034, filed on Sep. 13, 2001, now abandoned.

(60) Provisional application No. 60/236,863, filed on Sep. 29, 2000.

(51) Int. Cl.
*B29C 45/02* (2006.01)
*B29C 70/72* (2006.01)

(52) U.S. Cl. ........................... 264/272.15; 264/272.17; 264/276; 264/328.5; 425/116; 425/544

(58) Field of Classification Search ........... 264/272.15, 264/272.17, 276, 328.4, 328.5, 219, 272.14, 264/328.9; 425/572, 573, 588, 116, 117, 425/544; 29/831, 841
See application file for complete search history.

(56) References Cited

U.S. PATENT DOCUMENTS

| | | | | |
|---|---|---|---|---|
| 4,126,292 | A * | 11/1978 | Saeki et al. | 249/110 |
| 4,252,294 | A | 2/1981 | Uchio | |
| 4,641,418 | A * | 2/1987 | Meddles | 264/272.17 |
| 4,741,507 | A * | 5/1988 | Baird | 249/91 |
| 4,954,308 | A * | 9/1990 | Yabe et al. | 264/272.17 |
| 5,196,917 | A | 3/1993 | Ueda et al. | |
| 5,386,342 | A | 1/1995 | Rostoker | |
| 5,429,488 | A * | 7/1995 | Neu | 425/116 |
| 5,472,646 | A * | 12/1995 | Uchida et al. | 264/1.7 |
| 5,624,691 | A * | 4/1997 | Bednarz et al. | 425/116 |
| 5,635,220 | A * | 6/1997 | Izumi et al. | 425/116 |
| 5,650,177 | A * | 7/1997 | Kojima et al. | 425/116 |
| 5,723,126 | A | 3/1998 | Gargan et al. | |
| 5,723,156 | A * | 3/1998 | Matumoto | 425/116 |
| 5,744,083 | A * | 4/1998 | Bednarz et al. | 264/272.14 |
| 5,750,153 | A | 5/1998 | Shibata | |
| 5,780,078 | A | 7/1998 | Chen | |
| 5,891,384 | A | 4/1999 | Miyajima | |
| 6,015,280 | A * | 1/2000 | Blish et al. | 425/116 |
| 6,056,536 | A | 5/2000 | Schad et al. | |
| 6,319,450 | B1 * | 11/2001 | Chua et al. | 264/272.17 |
| 6,428,731 | B1 * | 8/2002 | Bernardus Peters et al. | 264/272.13 |

OTHER PUBLICATIONS

"Gate Design", Dupont , Surlyn Part and Mold Design Guide, Part 4, Downloaded from Internet at http://www.dupont.com/industrial-polymers_/surlyn/E-37240-2/part4.html, May 30, 2000, 3 pages.

(Continued)

*Primary Examiner*—Angela Ortiz
(74) *Attorney, Agent, or Firm*—Yingsheng Tung; Wade James Brady, III; Frederick J. Telecky, Jr.

(57) ABSTRACT

The mold for a thin package uses a gate which has a high aspect ratio, about 30 degrees or greater throughout the length of the gate. Additionally, the depth of the gate goes to zero at a point outside of the area of the finished package, but within the dam bars, so that the leadframe space acts as a virtual gate. This reduces the need for trimming and lowers stress on the finished package.

10 Claims, 7 Drawing Sheets

OTHER PUBLICATIONS

"Machine Nozzle", Dupont, Surlyn Part and Mold Design Guide: Part 3, Downloaded from Internet at http://www.dupont.com/industrial-polymers/surlyn/E-37240-2/part3.html, May 30, 2000, 3 pages.

"Unique Molding System Design Offers Superior Device Encapsulation", 1998 ChipScale Review, Dr. Daniel Wong, et al., Downloaded from Internet at http://www.chipscalereview.com/issues/0398/wky1.htm, May 7, 2000, pp. 1-9.

"7.2.1 Gate Size", Mold Design, Duracon™ Molding Tech., Polyplastics, Downloaded for Internet, May 30, 2000, Source unknown, pp. 1.

"Ryton® PPS Injection Molding Trouble Shooting Guide", Ryton Polyphenylene Sulfide Resins, Downloaded from Internet, at http://www.ryton-pps.com/DataSheets/TroubleShootingGuide.html, May 30, 2000, pp. 1-4.

"3.0 Device Construction", Downloaded from Internet, http://epims.gsfc.nasa.gov/ctre/act/techdocs/pems/pem3.html, May 7, 2000, pp. 1-17.

"2.0 Definitions, pp. 1-9, 4.0 General Characteristics, pp. 1-3, 5.0 Reliability Considerations pp. 1-8", Downloaded from Internet, http://misspiggy.gsfc.nasa.gov.ctre/act/techdocs/pems/pem2.htm, pem4.htm, pem5.htm, May 30, 2000.

* cited by examiner

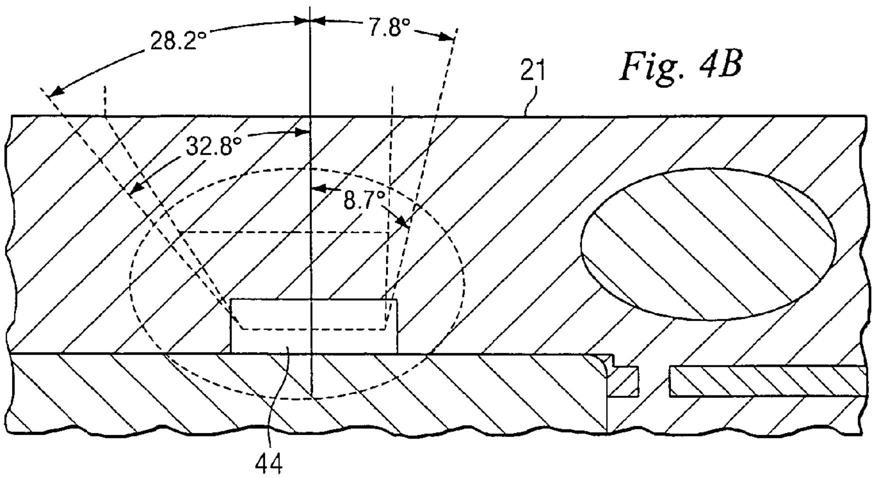
*Fig. 4B*
*Fig 5A Prior Art*
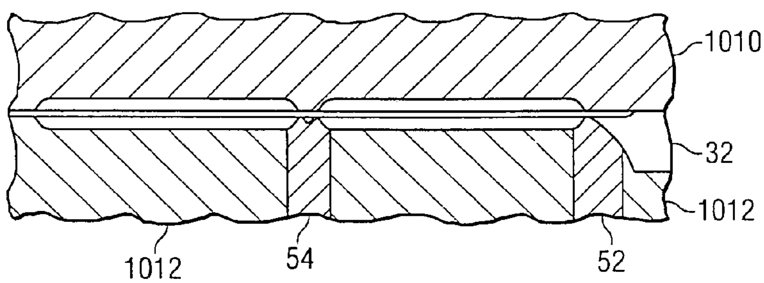
*Fig. 5B Prior Art*
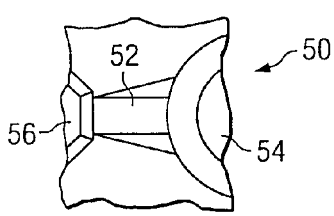
*Fig. 5C Prior Art*
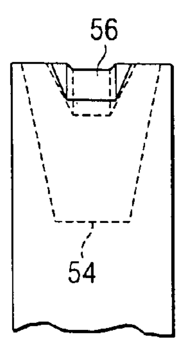
*Fig. 5D Prior Art*
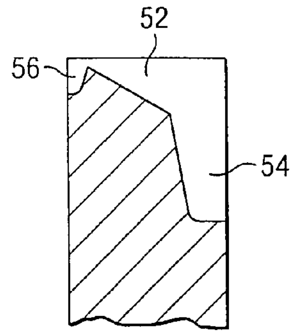

Prior Art

*FIG. 8B*
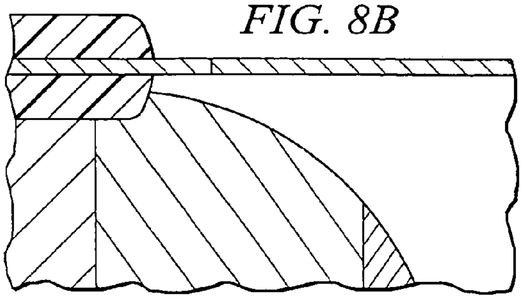
*Prior Art*
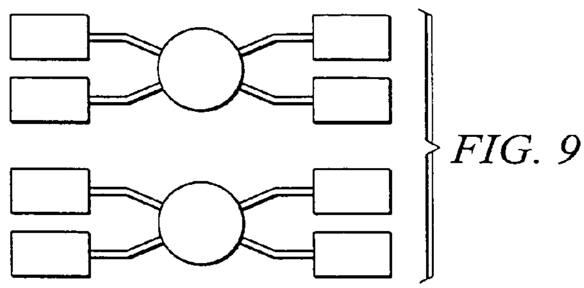
*Prior Art*
*FIG. 9*
*FIG. 10*
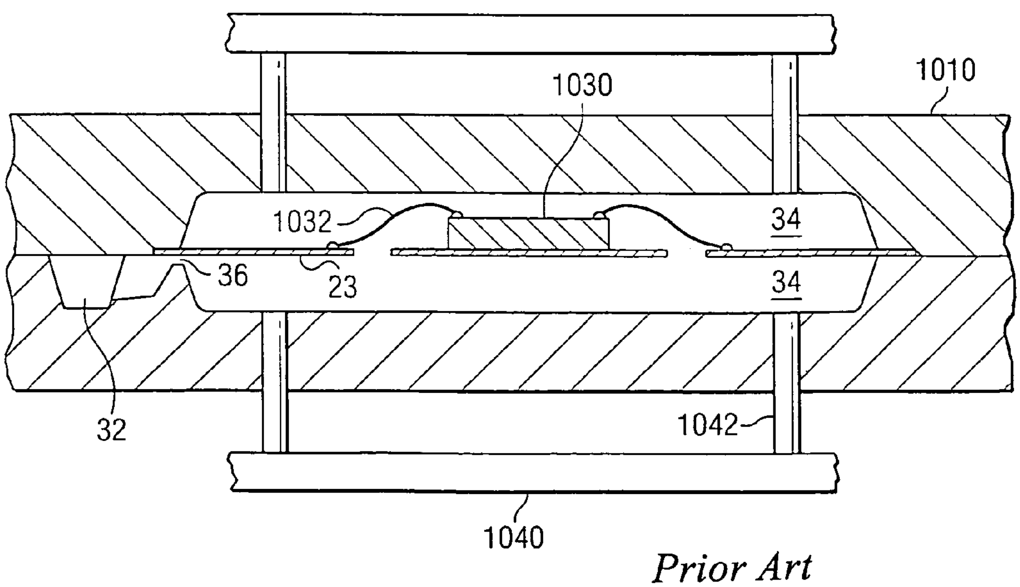
*Prior Art*

VIRTUAL GATE DESIGN FOR THIN PACKAGES

This is a divisional application of Ser. No. 09/953,034, filed Sep. 13, 2001, which is a non-provisional application claiming priority from provisional application Ser. No. 60/236,863, filed Sep. 29, 2000.

BACKGROUND AND SUMMARY OF THE INVENTION

The present invention relates to the encapsulation of microelectronics chips.

Background: General Encapsulation

After the fabrication of semiconductor wafers, there still remain the processes of protecting the sensitive wafers from environmental hazards, as well as providing connections to other devices. One of the most common solutions to these needs involves first attaching individual dies to a leadframe, then enclosing the die and portions of the leads in a covering of plastic.

FIG. 2 shows a typical leadframe cluster 21, in this case, for a 40-pin dual in-line plastic package. This leadframe cluster contains six separate leadframes 23, although this number can be modified, depending on the final size of the package. Each leadframe 23 contains the contacts for one semiconductor circuit. In the middle of the leadframe 23, there is an area where the die will be attached—the die paddle 20. Individual leads 22 fan out from the die paddle, on two or four sides of the die paddle, depending on the type of package. Shorting bars 24 are located between the leads for different packages and large shorting bars 25 connect together multiple ones of the frames. These shorting bars provide stability to the framework-during assembly and packaging, but will not be part of the final packages. Additionally, dam bars 26 are located just outside what will be the final package size and are used to prevent excess seepage of molten plastic out of the package during encapsulation. In at least some applications, especially where a large number of leads are closely packed, a small cutout on the inside edge of the dam bars, commonly called a gate window 27, is used to provide an opening for the encapsulant to be routed into the area surrounding the leads.

After individual semiconductor dies are separated from the wafer, they are attached to the die paddle 20 of a leadframe 28, using one of several available materials for that purpose. Thin wires are then bonded to each of the contacts on the chip, with their other end being bonded to one of the leads 22 on the leadframe. In this manner, electrical connections to the chip will be carried outside the finished package. After bonding, the leadframes will be encapsulated, with the most common method being by transfer molding in a cavity-chase mold.

Background: Chase Cavity Molds

FIG. 3A shows the overall layout of a chase cavity mold 31 which will be used to encapsulate the leadframe cluster shown in FIG. 2. The mold is of a durable metal construction, with interchangeable parts. A central pot 30 holds the encapsulant material while it is being melted, while runners 32 route the melted plastic from the pot 30 toward the enclosed leadframes 23. The portion of the mold which contains the leadframes and the runners in their immediate vicinity is an insertable piece which can be changed to allow for different packages to be encapsulated using the same chase mold.

Dotted lines 21 show how one leadframe cluster sits in the mold, with individual cavities 34 surrounding the individual leadframes in the shape of the desired package. Small gate runners lead to gates 36, which open into the individual cavities 34 to allow the plastic to enter. Because of the hardeners used in the encapsulant, the gate, where the flow is rapidly constricted, wears more heavily than other parts of the mold. For this reason, the gates are constructed on pins, having a circular or ovoid cross-section, which can be inserted or removed from the mold when necessary.

Sometimes the cavities are in two rows on either side of the runners, as shown in FIG. 3A. In this case, a primary gate 36 leads the plastic into a first cavity, while a secondary gate 38, having a different shape from the primary gates, routes the molten plastic from the first cavity into a second package.

The mold layouts of FIGS. 3A and 3B are considered unbalanced, because the runners to different cavities have different lengths. This contrasts with mold layouts in which the runners to all cavities are the same, as shown in FIG. 9, considered a balanced mold.

FIG. 10 shows a cross-section of a prior art mold, showing one cavity and its associated runner. The top half 1010 of the mold contains the top half of the cavity 34, plus relief for the presence of the leadframe 23, while the bottom half 1020 of the mold contains the bottom half of the cavity 34, plus the runner 32 and gate 36. The runner and gate will become closed channels when the mold closes, with the additional side formed by the opposite half of the mold and/or the leadframe. This drawing also shows the presence of the chip 1030 to be encapsulated, its bonding wires 1032, and the ejector plate 1040 and ejector pins 1042 which will be used to remove the encapsulated leadframes from the mold.

After the encapsulant has been distributed and cooled, the mold halves are separated and the ejector pins are used to remove the encapsulated leadframe cluster from the mold.

FIG. 7 shows a portion of the encapsulated leadframe cluster after it is removed from the mold. The section on the left shows how flash 710 can form on the leads during encapsulation as plastic leaks between the two mold halves. A "dejunking" operation is used to remove this flash, using, e.g., mechanical abrasion, to give the results on the right. After dejunking, the individual components are punched out of the leadframe. The dam bars and shorting bars are removed using an automatic punch press and the leads are trimmed, then formed to the desired configuration by bending them using a thin anvil.

The final package is shown in FIG. 6. Here again is seen the die 1030 attached to the die paddle 20, connected by bond wires 1032 to the leads 22, and surrounded by encapsulant 62.

Background: Gate Designs

FIG. 5 shows a side view of a mold, showing the relationship of the primary gate pin 52 and the secondary gate pin 54 to the upper 1010 and lower 1012 portions of the mold and to the runner 32. FIGS. 5A–C show three views of a gate pin. As seen in FIG. 5A, the gate pin 50 has a circular shape which can be slid into the mold. This will be connected to a portion of the pin which does not have a symmetric shape, to allow it to be inserted in only one position. A groove 52 runs across the pin, forming a channel which will carry molten encapsulant into the package. An inlet portion 54 of the pin has a depth which corresponds to the depth of the runner; an outlet portion 56 has a depth which corresponds to the package. The depth of the groove 52 varies from that of the inlet portion 54 to thai of the outlet portion 56. FIG. 5B shows a side view of the pin as it would be seen from the package. Outlet portion 56 can be seen, with portions of the channel which are hidden shown as dotted lines. Finally, FIG. 5C shows the pin in cross-section along z–z□ of FIG. 5A. In this diagram, it is easier to see how the depth varies across the pin.

FIGS. 8A–B diagrammatically show cross-sections of two prior art packages within the mold, with only the gate pin inserts shown cross-hatched. Note that in FIG. 8A, the angle between the gate and the leadframe is initially 30 degrees or greater as it leaves the runner, although this angle decreases to about 12 degrees prior to the junction with the package. The gate of FIG. 8B has a smooth arc, so that the angle at which it approaches the leadframe tapers off to a gentle slope near the edge of the package. Both these designs enable the smooth flow of the compound into the package, avoiding pinhole voids near the gate. Note that in both of these examples, the gate runs all the way to the edge of the package area, where it will open either directly into the package or into the gate window in the leadframe. This means that a substantial thickness of excess plastic, i.e., the plastic which cools inside the gate itself, will need to be trimmed away at trim time.

Examples of packages which have been encapsulated using prior art gates are shown in FIGS. 11A–B. In both of these photographs, encapsulation has been done, but the leadframes are still intact and the encapsulant which was present in the gate is still attached to the package. In the photos, you can also see the faint line in the plastic which shows where the gate pin was located. In FIG. 11A, a primary gate is seen leading from the runner, across the dam bar, and all the way up to the package. The edge of the gate window can just be seen near the edges of the gate/package junction. In FIG. 11B, a secondary gate runs over the dam bar between two packages, between their respective gate windows. After this point, the remainder of the gates are removed, along with the excess portions of the framework.

Background: Problems of Thin Packages

One trend in packaging today is that the packages are getting thinner, with thinner layers of plastic overlying the chip. This leads to greater susceptibility to cracking and chipping of the package during necessary processing steps. For example, at trim and form, a pinch cut is used to remove the plastic which was in the gate section of the mold at the time the mold was cooled. This can cause stress on the overall package and lead to cracking.

Virtual Gate Design for Thin Packages

The design disclosed herein includes a gate insert which, prior to or at the edge of the package, has a depth no deeper than the thickness of the leadframe. Here, within the dam/shorting bars of the leadframe, the encapsulant flows into the package using only the vertical space which exists between the leads, thus the term "virtual gate". Additionally, the gate maintains an angle of approach to the leadframe which is 30 degrees or greater.

The disclosed innovations, in various embodiments, provide one or more of at least the following advantages:

reduces gate chip;

improves yield;

extends mold tool life (i.e., gate wears at a slower rate);

eliminates pinch cut at trim and form;

reduces external stress on package.

BRIEF DESCRIPTION OF THE DRAWING

The disclosed inventions will be described with reference to the accompanying drawings, which show important sample embodiments of the invention and which are incorporated in the specification hereof by reference, wherein:

FIG. 4B shows a detail of the area shown at A.

FIG. 5A shows the location of the gate pin in relation to other parts of the mold.

FIGS. 5B–D show three views of a gate pin for a chase mold.

FIGS. 8A–B diagrammatically show cross sections of two prior art packages at the gate piece.

FIG. 9 shows an example of a balanced mold.

FIG. 10 shows a cross-section of a prior-art mold with leadframe in place, just prior to encapsulation.

DETAILED DESCRIPTION OF THE PREFERRED EMBODIMENTS

The numerous innovative teachings of the present application will be described with particular reference to the presently preferred embodiment (by way of example, and not of limitation).

Figure 4A:
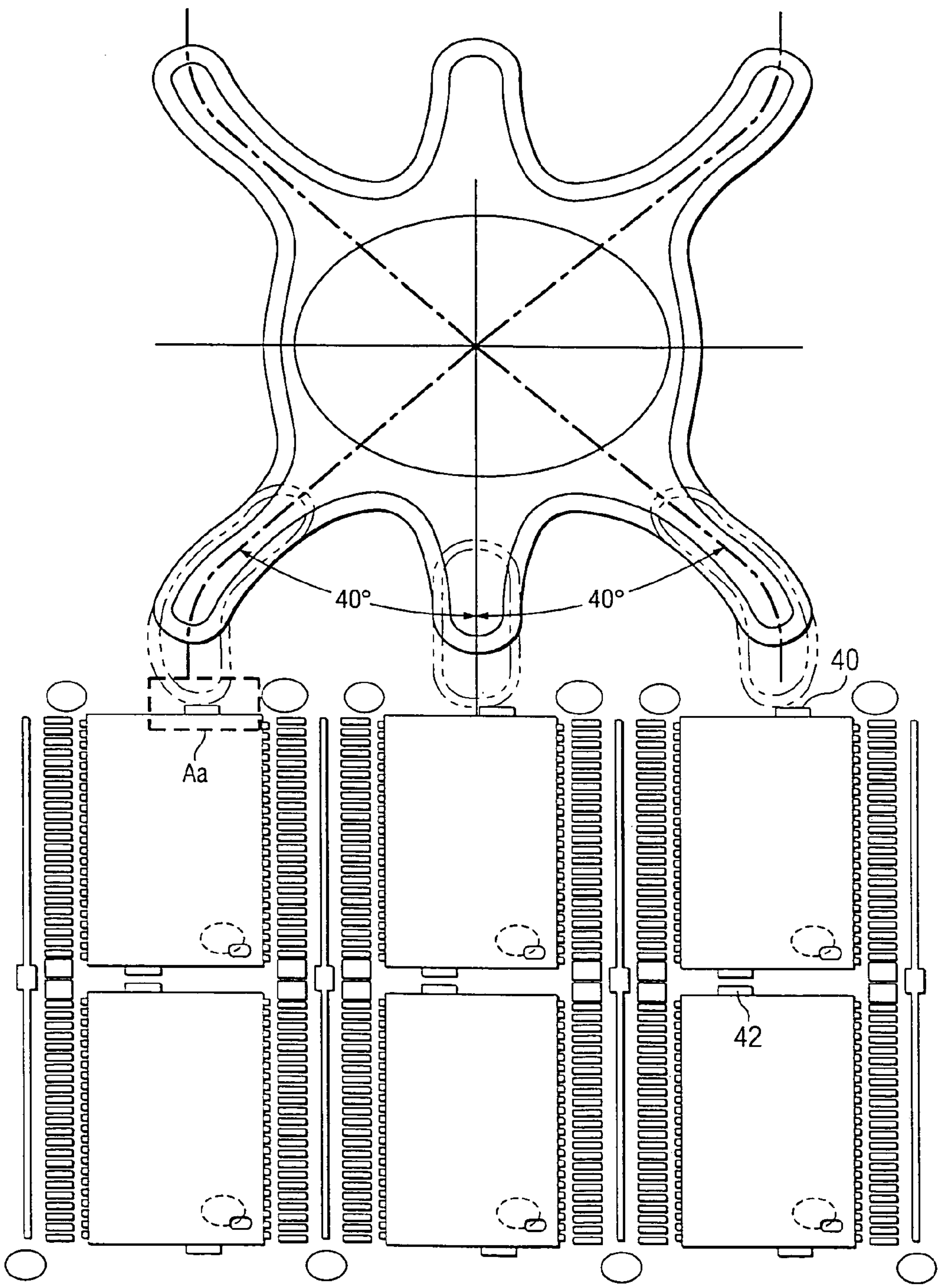
FIG. 4A shows a mold layout which uses the disclosed gate.
Figure 6:
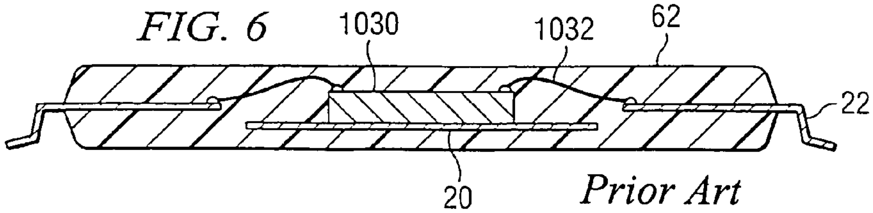
FIG. 6 shows a cross-section of a finished encapsulated package.

FIG. 4A is a diagram of a mold which uses the innovative gate. This is an unbalanced type mold which utilizes both primary and secondary gates. As shown, the primary 40 and secondary 42 gates are not in a direct line with each other, but are offset somewhat. FIG. 5A is a cross-sectional view of the mold cut through two of the packages. The insert 52 for the primary gates 40 is shown on the right side, and the insert 54 for the secondary gates 42 is shown on the left side. This is for illustration only, as the two gates would not generally appear in the same cross-section due to their offset.

FIG. 4B is a detail of area "a" from FIG. 4A, showing how the gate opens into the gate window 44.

Figure 1A:
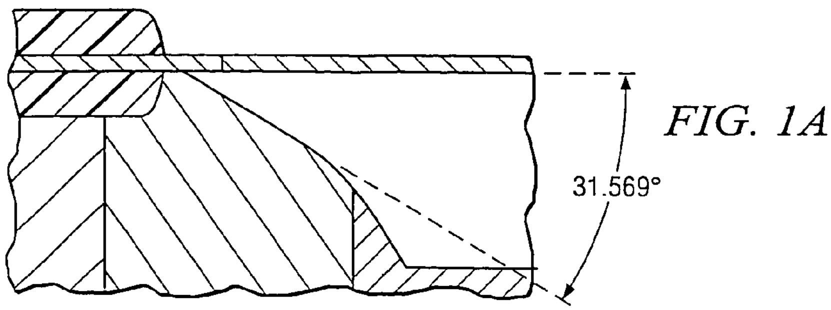
FIGS. 1A–C diagrammatically show three innovative gate inserts, each ending with a channel depth which is no thicker than the space left for the leadframe.
Figure 1B:
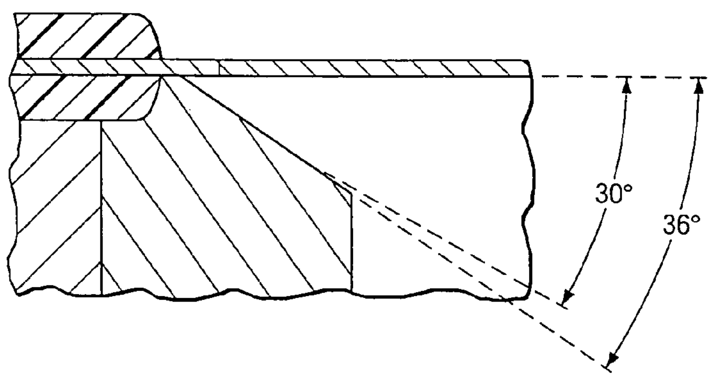
Figure 1C:
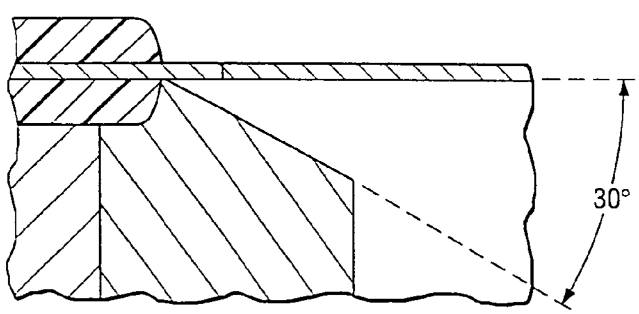

FIGS. 1A–C diagrammatically show a cross-section of three primary gate inserts which use the inventive gate design disclosed herein, each ending with a channel depth which is no thicker than the space left for the leadframe. Each of these is a cross-section as it would appear at line x–x' of FIG. 4A, and each will be discussed.

Figure 7:
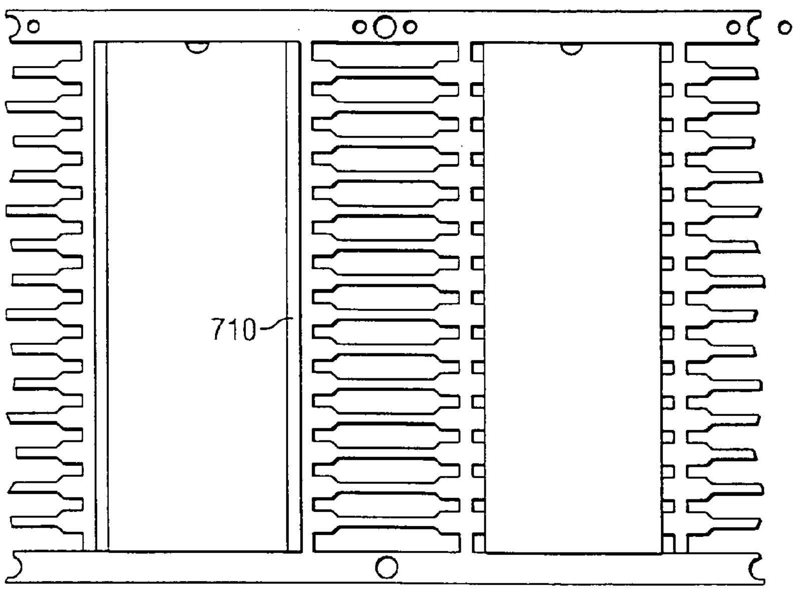
FIG. 7 shows the leadframe cluster after encapsulation but before separation.

In all the embodiments below, once the leadframe is removed from the mold after encapsulation, the gate is only attached to the package by a film of plastic no thicker than the flash of FIG. 7. This connection can be removed in the dejunking operation, rather than requiring a trim procedure.

Primary Gate: First Embodiment

Figure 8A:
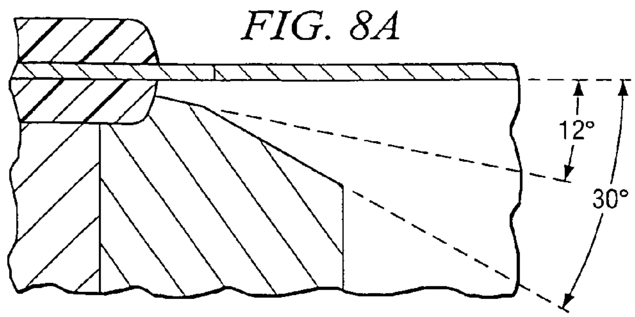
Figure 11A:
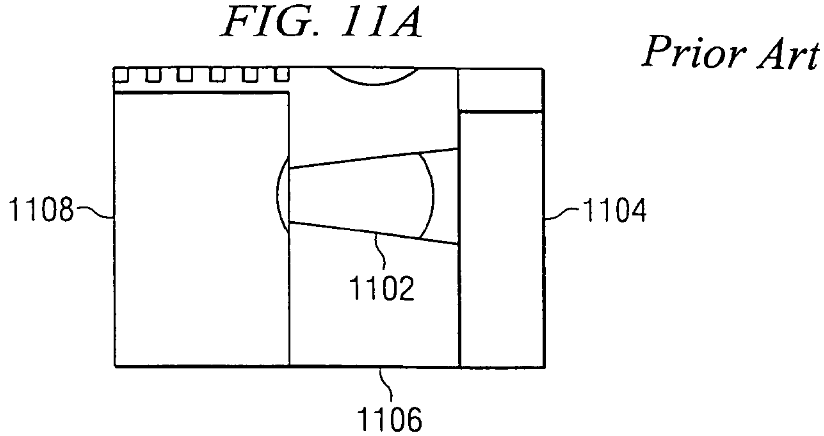
FIGS. 11A–B are photographs of the encapsulant impression of a primary and a secondary gate from a prior art method.
Figure 11B:
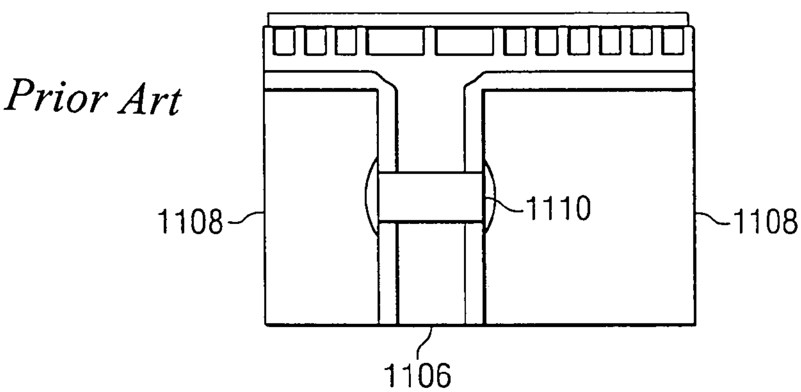

In one embodiment, shown in FIG. 1A, the gate near the runner has a curved "floor", with the same radius of curvature as in prior art FIG. 8B. In the innovative gate, however, the angle between the gate pin and the leadframe stops diminishing at 31.569 degrees and thereafter remains constant. Additionally, the depth of the gate, as measured between the "floor" of the channel and the plane of the leadframe, goes to zero prior to the edge of the package, utilizing the space between the leads as a virtual gate.

Primary Gate: Second Embodiment

In an alternate embodiment, seen in FIG. 1B, the gate initially converges at an angle of 36 degrees to the leadframe, with a single change of angle approximately halfway across the insert to 30 degrees. Again, the depth of this gate goes to zero prior to the edge of the package.

Primary Gate: Third Embodiment

In a further alternate embodiment, in FIG. 1C, the depth of the gate converges at a constant 30 degree angle from the leadframe. In this version, the depth of the gate does not go to zero until the point where it intersects the package itself.

Secondary Gate

Figure 1D:
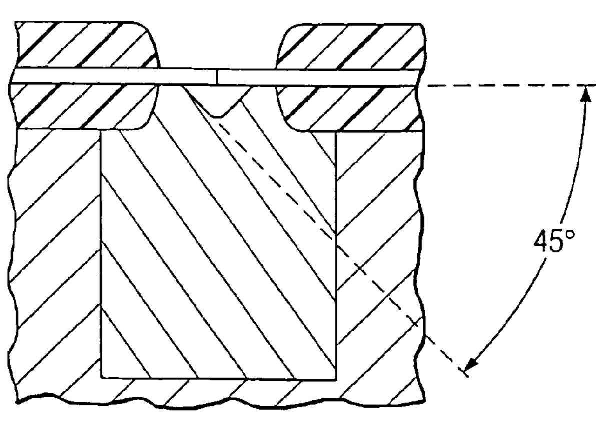
Figure 2:
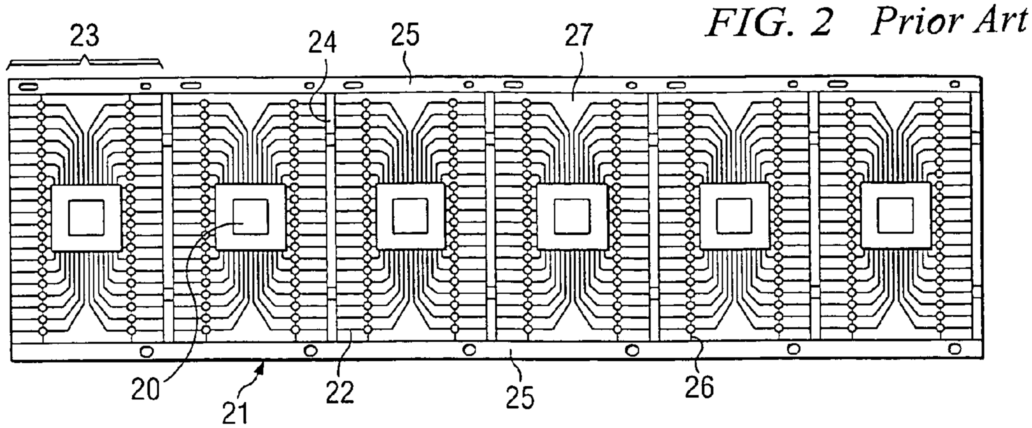
FIG. 2 shows a typical leadframe cluster for a dual in-line package.
Figure 3A:
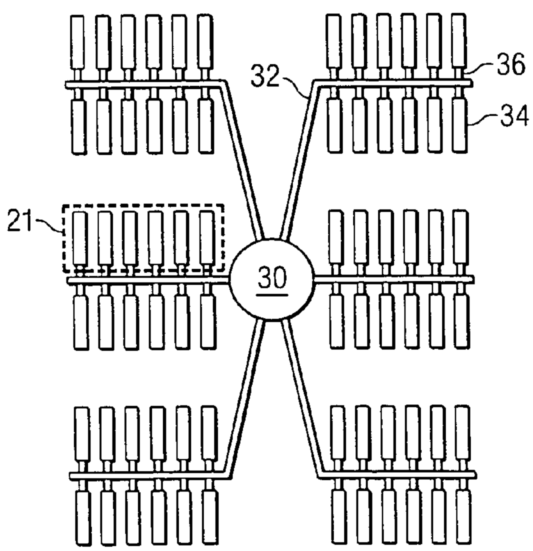
FIG. 3A shows schematically how a mold can be arranged and how the leadframe cluster of FIG. 2 fits into the mold.
Figure 3B:
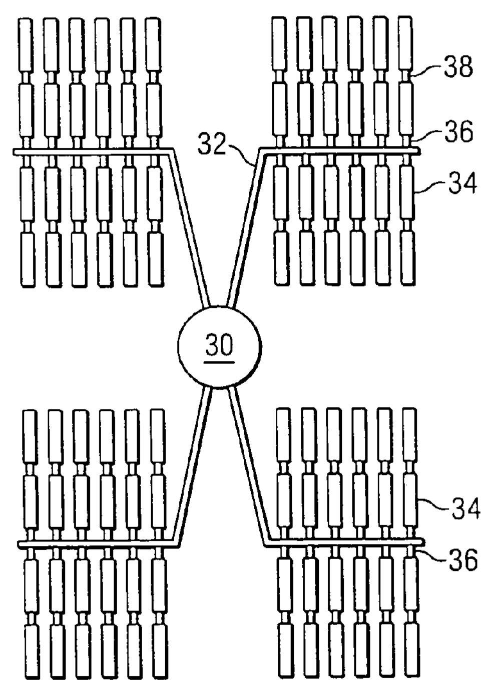
FIG. 3B shows an alternate mold arrangement in which secondary gates are used.

The presently preferred embodiment of the secondary gate is shown in FIG. 1D. This is seen taken at the line y–y' of FIG. 4A. Adjacent to each of the packages it joins, the secondary gate has a depth of zero, depending solely on the relief space between adjacent leads to form a virtual gate. In order that the encapsulant can traverse the dam bars between the two packages, the depth of the secondary gate diverges and then reconverges with the plane of the leadframe at an angle of approximately 45 degrees, with the open area thus formed extending inside each of the two leadframe windows.

Figure 12:
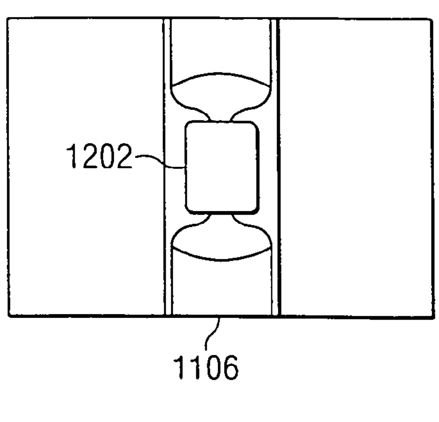
FIG. 12 is a photograph of the encapsulant impression of a secondary gate using the presently disclosed inventive gate structure.

FIG. 12 is a photograph of the plastic impression made of the secondary gate after the mold has been separated. A dam bar is seen, separating two different packages, with gate windows formed as cutouts on either side of the dam bar. The dark area in the center of the photograph is the small secondary gate which connects the two gate windows. Note that this secondary gate does not directly abut the package, but only bridges the gap between the two gate windows. Rather, the encapsulant nearest the package is no thicker than the flash seen in FIG. 7, and can be removed in the dejunking operation.

Evaluation Results

Following ate test results of packages encapsulated using the innovative gate design.

SMS #8587666

Dev. 8W244ADGGR

L/F 385

M/C 2141

Qty 2952

Compound KMC-288P

Batch #811022

Mold Parameters:

Preheat 8 sec.

Injection speed 1.5 mm/sec

Mold temperature 174° C.

Transfer time 9.3 seconds

OFFSET/OFFCENTER (MILS):

| | X | Y |
|---|---|---|
| Minimum | 0.007 | 0.007 |
| Maximum | 0.130 | 0.158 |
| Average | 0.058 | 0.071 |
| Standard deviation | 0.046 | 0.053 |

Wire Deflection:

Minimum 2.23%

Maximum 6.85%

Average 4.62%

Standard deviation 1.32

O/S:

Wire sweep pattern is marginal. No major concern.

According to a disclosed class of innovative embodiments, there is provided: An encapsulated chip, comprising: an integrated circuit chip; leads to which said integrated circuit chip is bonded electrically; an encapsulation material which encloses said integrated circuit chip and a portion of said leads, said encapsulation material having no trim marks.

According to another disclosed class of innovative embodiments, there is provided: A mold for chip encapsulation, comprising: first and second mold halves; said first mold half having a first cavity for forming approximately one half of an encapsulated package and for containing a leadframe; said second mold half having a second cavity for forming approximately one half of an encapsulated package; a runner cavity for directing molten encapsulant toward said first and second cavities; a gate pin having a gate cavity for directing molten encapsulant between said runner cavity and said first and second cavities, wherein said gate cavity has a depth which goes to zero at or before said first and second cavities.

According to another disclosed class of innovative embodiments, there is provided: A gate pin for a mold for chip encapsulation, said gate pin comprising a channel for directing molten encapsulant between a runner and a package cavity, wherein said channel has a depth which goes to zero at or before an intersection with said package cavity.

According to another disclosed class of innovative embodiments, there is provided: A method of encapsulating an integrated circuit chip, comprising the steps of: placing a leadframe containing an integrated circuit chip within a mold; routing molten encapsulation material into said mold through a gate whose depth goes to zero outside of the space occupied by the finished package.

According to another disclosed class of innovative embodiments, there is provided: A method of encapsulating an integrated circuit chip, comprising the steps of: placing a leadframe containing an integrated circuit chip within a mold; routing molten encapsulation material into said mold through a gate whose angle of convergence with said leadframe is greater than about 30 degrees.

The following background publication provides additional detail regarding possible implementations of the disclosed embodiments, and of modifications and variations thereof, and the predictable results of such modifications: *Encapsulation*, by the staff of Texas Engineering Extension Service (TEEX), which is hereby incorporated by reference.

Modifications and Variations

As will be recognized by those skilled in the art, the innovative concepts described in the present application can be modified and varied over a tremendous range of applications, and accordingly the scope of patented subject matter is not limited by any of the specific exemplary teachings given.

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "means for" are followed by a participle.

What is claimed is:

1. A method for encapsulating an integrated circuit chip, comprising the steps of:

attaching an integrated circuit chip to a leadframe having a top leadframe surface and a bottom leadframe surface;

providing a mold including a first mold member and a second mold member with matching surfaces, each mold member having a cavity formed therein to house cooperatively the attached chip;

the first mold member having a gate member near an edge of the cavity, the gate member having a bottom portion and a slanted groove, the top edge of the groove substantially level with the matching surface near the edge of the cavity;

closing the first and the second mold members on the leadframe so the matching surfaces contact the top and bottom leadframe surfaces and the top of the slanted groove a leadframe-thickness distant from the matching surface of the second mold member; and injecting encapsulant material into the cavities via the inclined groove of the gate member to form a package.

2. The method of claim 1, in which the gate member comprises an insertable member.

3. The method of claim 1, in which the mold members have an array of cavities formed therein.

4. The method of claim 3, in which the first half mold member further has a secondary gate member between cavities.

5. The method of claim 1, further comprising a step of forming a dejunkable member of the encapsulant material coupled to the package, corresponding to the gate member, a portion of the dejunkable member near the package having a thickness substantially equaling the thickness of the leadframe.

6. The method of claim 5, further comprising a step of de-junking for removing the dejunkable member from the package and leaving thereon a dejunk-mark.

7. The method of claim 1, in which the top of the groove is about 0.2 mils from the edge of the cavity.

8. The method of claim 1, in which the top of the groove is about 0.004 mils from the edge of the cavity.

9. The method of claim 1, in which the angle of incline near the top of the groove is about 30 degrees with respect to the matcbing surface of the first mold member.

10. A method for making an encapsulated integrated circuit device, comprising the steps of:

attaching an integrated circuit chip to a leadframe, the leadfranie having a top surface and a bottom surface;

providing a mold having a cavity and a gate at an edge of the cavity, the gate including an opening into the cavity;

placing the integrated circuit chip and a portion of the leadframe in the cavity near the gate, the gate-opening having a top surface not extending above top surface of the leadframe and a bottom surface not extending below the bottom surface of leadframe; and injecting encapsulant material through the gate into the cavity to encapsulate the integrated circuit chip.

* * * * *